(12) United States Patent
Deval et al.

(10) Patent No.: US 9,509,321 B2
(45) Date of Patent: Nov. 29, 2016

(54) MAIN CLOCK HIGH PRECISION OSCILLATOR

(71) Applicant: Microchip Technology Incorporated, Chandler, AZ (US)

(72) Inventors: Philippe Deval, Lutry (CH); Gabriele Bellini, Froideville (CH); Patrick Besseux, Mont-sur-Rolle (CH); Francesco Mazzilli, Renens (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 14/554,570

(22) Filed: Nov. 26, 2014

(65) Prior Publication Data

US 2015/0146832 A1    May 28, 2015

Related U.S. Application Data

(60) Provisional application No. 61/909,632, filed on Nov. 27, 2013.

(51) Int. Cl.
| | |
|---|---|
| *H03L 7/085* | (2006.01) |
| *H03L 1/00* | (2006.01) |
| *H03L 7/089* | (2006.01) |
| *H03L 7/099* | (2006.01) |
| *H03L 7/097* | (2006.01) |
| *H03L 7/081* | (2006.01) |
| *H03L 7/093* | (2006.01) |

(52) U.S. Cl.
CPC ............... *H03L 7/085* (2013.01); *H03L 1/00* (2013.01); *H03L 7/089* (2013.01); *H03L 7/099* (2013.01); *H03L 7/081* (2013.01); *H03L 7/093* (2013.01); *H03L 7/097* (2013.01)

(58) Field of Classification Search
CPC ....... H03L 7/181; H03L 7/085; H03L 7/097; H03L 7/0991; H03L 7/099; H03L 7/089; H03L 1/00
See application file for complete search history.

(56) References Cited

U.S. PATENT DOCUMENTS

| | | | | | |
|---|---|---|---|---|---|
| 4,355,304 | A | * | 10/1982 | Kasuga ................ | H04B 14/048 341/110 |
| 5,040,193 | A | * | 8/1991 | Leonowich ............. | H03M 5/12 341/70 |
| 5,521,556 | A | * | 5/1996 | O'Shaughnessy ... | H03K 3/0315 331/1 R |
| 5,835,402 | A | * | 11/1998 | Rao ..................... | G11C 16/0441 365/102 |
| 6,785,327 | B1 | * | 8/2004 | Larsson ............ | H04L 25/03133 370/290 |

(Continued)

FOREIGN PATENT DOCUMENTS

GB             2350949 A      12/2000  ............... H03K 3/02

OTHER PUBLICATIONS

A.P. Godse et al., Digital Techniques, 2010, Techincal Publications Pune, First Edition, p. 6-3.*

(Continued)

*Primary Examiner* — Eva Puente
*Assistant Examiner* — Michelle M Koeth
(74) *Attorney, Agent, or Firm* — Slayden Grubert Beard PLLC

(57) ABSTRACT

A clock oscillator includes a high speed oscillator generating a high speed clock signal and comprising a digital trimming function; a counter receiving said high speed clock signal at a clock input; a time base having a low drift and controlling said counter, wherein the counter generates a difference between a reference value and a counter value; and a digital integrator receiving said difference value and providing trimming data for said high speed oscillator.

34 Claims, 6 Drawing Sheets

(56) References Cited

U.S. PATENT DOCUMENTS

| | | | |
|---|---|---|---|
| 6,909,388 B1 | 6/2005 | Quiquempoix et al. | 341/143 |
| 8,415,975 B1* | 4/2013 | Birsan | G06F 13/00 326/38 |
| 8,552,804 B1 | 10/2013 | Ren et al. | 331/2 |
| 2003/0137356 A1* | 7/2003 | Kappes | H03L 7/00 331/34 |
| 2003/0155985 A1* | 8/2003 | Toliver | H03K 3/011 331/175 |
| 2009/0147899 A1 | 6/2009 | Arviv et al. | 375/359 |
| 2009/0316847 A1* | 12/2009 | Thomsen | H03L 7/085 375/373 |
| 2011/0084768 A1* | 4/2011 | Hammond | H03L 7/1976 331/18 |
| 2012/0098570 A1* | 4/2012 | Wang | H03L 7/199 327/7 |
| 2013/0212357 A1* | 8/2013 | Plondke | G06F 9/30014 712/208 |
| 2016/0019898 A1* | 1/2016 | Schreiner | G10L 19/0017 704/500 |

OTHER PUBLICATIONS

Graf, Modern Dictionary of Electronics, 1999, Newnes, 7$^{th}$ Edition, p. 198.*

International Search Report and Written Opinion, Application No. PCT/US2014/067684, 11 pages, Feb. 25, 2015.

* cited by examiner

MAIN CLOCK HIGH PRECISION OSCILLATOR

CROSS REFERENCE TO RELATED APPLICATIONS

This application claims priority from U.S. Provisional Patent Application Ser. No. 61/909,632 filed Nov. 27, 2013, which is hereby incorporated by reference in its entirety as if fully set forth herein.

TECHNICAL FIELD

The present disclosure relates to a clock oscillator, in particular a main clock high precision oscillator.

BACKGROUND

Integrated circuits with integrated oscillator circuitry that do not require an external component are difficult to design with high precision. For example, some circuits with internal oscillators can achieve a precision of ±1% over temperature after calibration. However, when a higher precision is required, an external crystal or clock recovery is required to achieve the respective precision.

For example, the Controller Area Network bus is a bus standard originally designed for vehicles that allows devices to communicate without a host computer. An enhancement of the standard is known as CAN with Flexible Data Rate (CANFD). The CANFD standard, however, requires advanced precision. In particular, the required precision may be on the order of 0.4%. Integrated devices implementing this or other standards/applications with such high precision may require external components or require advanced circuitry to achieve the required precision. Hence, there exists a need for an improved clock oscillator for digital systems.

SUMMARY

According to various embodiments, a high precision oscillator, for example a 40 MHz oscillator, with less than 0.2% frequency deviation over supply voltage and −40 to 160° C. is provided. To this end, a non-accurate but very low drift time base is used as a time reference in a digitally controlled oscillator. According to various embodiments, an inaccurate timebase is used as a reference timebase for monitoring the servo-loop of a very accurate clock generator. A clock oscillator in accordance with embodiments includes a high speed oscillator generating a high speed clock signal and comprising a digital trimming function; a counter receiving said high speed clock signal at a clock input; a time base having a low drift and controlling said counter, wherein the counter generates a difference between a reference value and a counter value; and a digital integrator receiving said difference value and providing trimming data for said high speed oscillator.

In some embodiments, the reference value is permanently stored by a OTP code. In some embodiments, the time base is an RC time base. In some embodiments, the time base is reset by said counter. In some embodiments, the counter is configured to receive a time base output at an enable input. In some embodiments, the reference value is an estimate of the duration of a time base. In some embodiments, the trimming data is indicative of the difference value and a previous period trimming data. In some embodiments, the counter is an up down counter.

An integrated circuit in accordance with embodiments includes a time base circuit generating a time reference; a counter receiving the time reference and configured to generate an error signal based on the difference between the count number of HF clock pulses occurring along the time reference duration and a calibration number; a digital integrator configured to generate a trimming function based on the error signal; and a high speed oscillator controllable using the trimming function and configured to provide HF clock pulses to the counter.

In some embodiments, the error signal is based on the difference between the number of HF clock pulses occurring along the time reference duration and a programmable calibration code. In some embodiments, the programmable calibration code is stored into a one time programmable memory (one time programmable calibration code). In some embodiments, the programmable calibration code is stored into a nonvolatile rewritable memory. In some embodiments, the time base circuit comprises a low drift RC circuit. In some embodiments, the time base circuit may be provided through a watch crystal. In some embodiments, the programmable calibration code is representative of a duration of the time base (reference) provided by of the low drift RC circuit. In some embodiments, the programmable calibration code is representative of the duration of one period of a 32.768 KHz watch crystal. In some embodiments, the programmable calibration code is representative of the duration of m periods of a low cost crystal (typically 128 periods for a 4 MHz crystal). In some embodiments, the time reference is based on a single cycle of an output of the low drift RC circuit. In some embodiments, the time reference is based on a multiple cycles of an output of the low drift RC circuit. In some embodiments, the time reference is based on a single period of a 32.768 KHz watch crystal. In some embodiments, the time reference is based on a multiple periods of a 32.768 KHz watch crystal. In some embodiments, the time reference is configured to enable the counter. In some embodiments, the error code size may be limited in order saving area. In some embodiments, the Most Significant Bits (MSB) of the error code may be shifted at the integrator input in order to reduce the tuning time. In some embodiments, a different shift may be applied according to the bit weight. In some embodiments, the HF oscillator may be operated at a multiple of the final HF output frequency.

A method in accordance with embodiments includes generating a time reference based on a time base; HF oscillator providing HF clock; counting HF clock pulses during duration of the time reference; generating an error signal based on the HF clock pulses count of the duration of the time reference and a calibration signal; generating a trimming code based on the error signal; and controlling a high speed oscillator using the trimming signal.

In some embodiments, the calibration signal is a one time programmable signal representative of an estimated error in the time reference. In some embodiments, the time reference is generated using a low drift RC circuit. In some embodiments, the time reference is generated using a single comparator receiving as input a single cycle of the low drift RC circuit output. In some embodiments, the time reference is input to an enable input of a counter for counting the duration of the time reference.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and various features and advantageous details thereof are explained more fully with reference to the exemplary, and therefore non-limiting, embodiments illustrated in the accompanying drawings and detailed in the following description. It should be understood, however, that the detailed description and the specific examples, while indicating the preferred embodiments, are given by way of illustration only and not by way of limitation. Descriptions of known programming techniques, computer software, hardware, operating platforms and protocols may be omitted so as not to unnecessarily obscure the disclosure in detail. Various substitutions, modifications, additions and/or rearrangements within the spirit and/or scope of the underlying inventive concept will become apparent to those skilled in the art from this disclosure.

Figure 1:
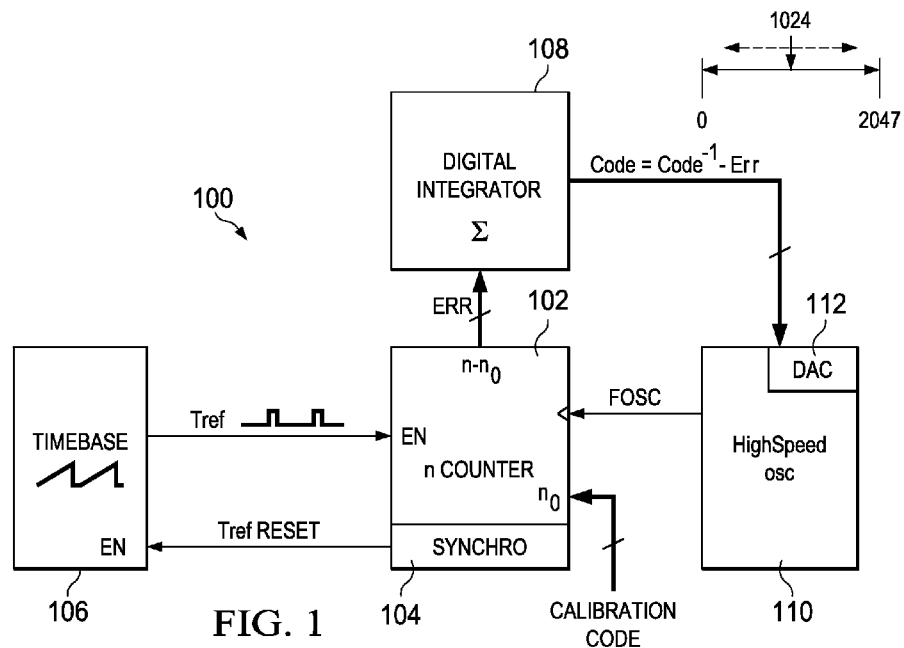
FIG. 1 is a diagram illustrating a system in accordance with embodiments.

Turning now to the drawings and, with particular attention to FIG. 1, a block diagram of an on-chip oscillator is shown according to various embodiments. The on-chip oscillator may be embodied as a 40 MHz internal oscillator and may be used to achieve a 5 Mbps communication in applications such as CAN or CANFD. The CANFD standard requires a ±0.4% precision of its internal oscillator over an operating temperature range of −40° C.<Temp<150° C. and its specified supply voltage range. It is noted, however, that while this example of required precision may apply for the CANFD standard, other parameters may apply for other applications. Hence, CANFD requirements are merely disclosed to explain a typical application.

In the embodiment illustrated, the on-chip oscillator 100 may comprise a low drift time base 106, a counter/synchronization unit 102, a digital integrator 108, and a high speed digital oscillator 110. The counter 102 may include or may be in communication with a synchronization unit 104 and the high speed digital oscillator 110 may include or be in communication with a digital to analog converter (DAC) 112.

In the example illustrated, the high speed digital oscillator 110, which may be embodied as a high frequency digitally-controlled oscillator (DCO), generates an output signal Fosc fed to a clock input of counter/synchronization unit 102. The counter/synchronization unit 102 implements a digital decrementer/counter which is enabled by the output Tref of the low drift time base 106. As will be explained in greater detail below, the low drift time base 106 may be implemented as an internal low frequency RC time base having a very low drift "Very low drift" is herein defined in some embodiments as a maximum drift (variation) of +/−0.2% of the RC time base over the whole operating temperature range of −40° C. to 150° C. and operating voltage supply range. This maximum allowed drift of +/−0.2% takes into account a calibration accuracy of +/−0.2% of the central frequency, granting a maximum total error of 0.4% (0.2% calibration+0.2% drift). This maximum allowed drift of +/−0.2% induces a maximum drift of 20 ppm/° C. for the RC time base (ppm is parts per million). Suitably low drift may be achieved using PIP (Poly Insulator Poly), MIP (Metal Insulator Poly), or MIM (Metal Insulator Metal) capacitors and high precision resistors like TFR (Thin Film Resistor) for building the RC time constant.

The synchronization unit 104 provides a Tref reset signal for resetting the low drift time base 106. The reset signal for the Tref signal may occur once the time base ramp has elapsed as shown in FIG. 3 and may have a duration of a certain number of clock periods of the high speed digital oscillator 110. The number of clock periods should be large enough for ensuring a full reset of the RC time base, but nothing occurs during this reset time and thus resetting the time base longer than required is wasted time waiting for the next calibration time. Therefore, the number of clock periods counted during the reset of the RC time base shouldn't be too large. The example number of 32 in FIG. 3 is a trade-off that should cover most of the situations, although other numbers may be used.

As will be explained in greater detail below, the counter 102 begins counting in response to each pulse received from the time base 106. The digital integrator 108 receives and integrates the difference ERR between the counted value n and a reference value n0 (i.e., ERR=n−n0). The digital integrator 108 generates a trimming code that controls the high speed oscillator 110. In some embodiments, the trimming code is CODE=CODE$^{-1}$−ERR, where CODE$^{-1}$ is the value for the previous time period.

The trimming code may control the high speed oscillator 110 through the digital to analog converter (DAC) 112, which may be designed as an integral part of the high speed oscillator 110. However, the DAC 112 can also be implemented external to the oscillator 110 according to other embodiments. In operation, the high speed digitally controlled oscillator 110 is adjusted in order to have n0 times of an associated clock period (Thf) equal to the duration of the very low drift RC time base 106 (Tref). In other words, Tref=n0*Thf. The number n0 is stored into a nonvolatile memory that may typically be an OTP (One Time Programmable). However a rewritable memory may be used, as well, offering to users the ability to modify the calibration during product life.

For each time base cycle, the error ERR between the calibrated value and counter value is passed to the digital integrator 108 which provides a new digital trimming code value to the high speed digitally controlled oscillator 110.

A great advantage over existing solutions is that the very low drift RC time base 106 itself is never calibrated. Calibrating the RC time base 106 would require extra resistors and/or capacitors and bank(s) of calibrating switches and/or one or more programmable current mirrors (this list is not exhaustive). Switches (and/or programmable current mirrors) add parasitic resistances, capacitances, and leakage currents that are usually temperature dependent. This would increase the drift of the RC time base. Instead, in embodiments, the only thing that is calibrated is the n0 counting number in order to output the correct frequency.

The very low drift RC time base 106 is stable over supply voltage, temperature, and aging but its original duration is inaccurate and subject to process variations. The very low drift RC time base 106 offers advantages over prior RC relaxation oscillators for reference because in a relaxation oscillator, the system has to compare twice the time base ramp to a reference value (one time per half period) which introduces two times the propagation delay of the comparator (It is very difficult to design a comparator with stable propagation delay over temp and supply voltage). However, using a single time base periodically reset by the system in accordance with embodiments allows having only one propagation delay, doing that, the variation of the drift of the propagation delay occurs only once. Thus, error due to the drift of propagation delay of the comparator is relatively divided by two in the single time base approach of embodiments.

Figure 2A:
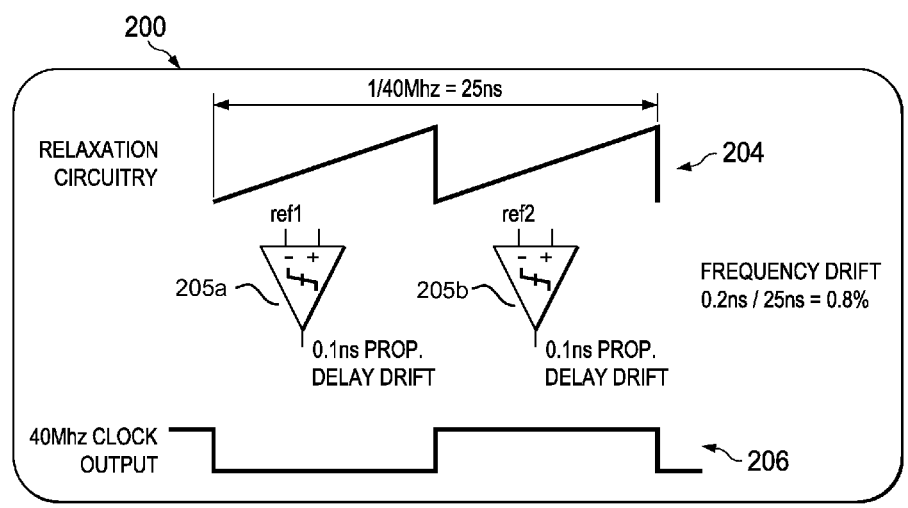
FIG. 2A and FIG. 2B illustrate exemplary operation of embodiments.
Figure 2B:
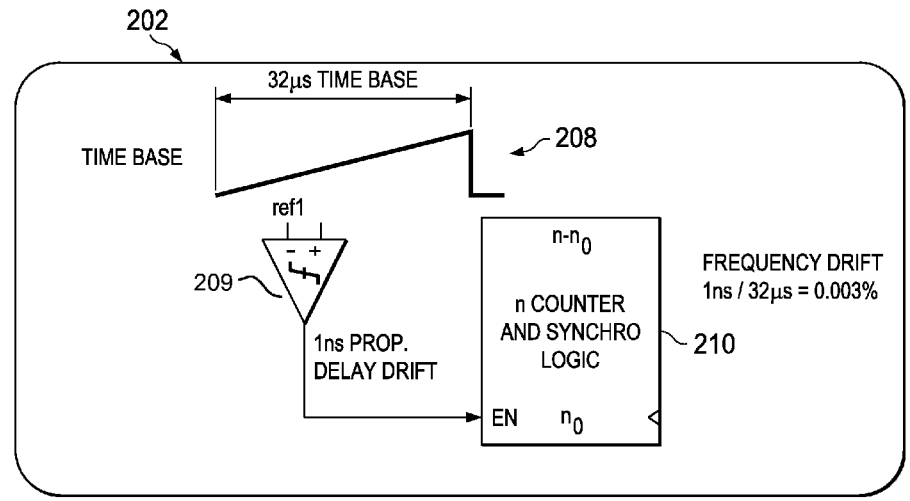

FIG. 2A and FIG. 2B illustrate advantages of embodiments. More particularly, FIG. 2A illustrates a conventional clock adjustment/calibration system, while FIG. 2B illustrates a system according to embodiments.

As shown at 202 in FIG. 2A, conventional relaxation circuitry produces a reference waveform 204 which is used to generate clock output 206. Comparators 205a, 205b receive as inputs references ref1 and ref2, respectively, as well as the output of the relaxation circuitry 204. Since a comparator is required for each half of the output waveform, considerable propagation delay can result. In this case, frequency error from the propagation delay is, for example, 2 ns/25 ns or 8%. Practically, the comparator propagation delay may be included into the half pulse duration. So this isn't necessarily an issue as long as this propagation delay is perfectly stable over the temperature and supply voltage range. Unfortunately, this is usually not the case. So any deviation of the propagation delay induces a deviation of the half period duration and thus the frequency accuracy. Assuming a deviation of 0.1 ns (100 ps) of the propagation delay of comparators 205a and 205b, this induces an error of 0.2 ns on the full 25 ns or 0.8%. This is already twice the maximum allowed error, not taking into account the other errors that will cumulate with it. Moreover reaching 100 ps maximum propagation delay drift over temperature and supply voltage ranges for comparators 205a and 205b is almost impossible to achieve.

In contrast, as shown in FIG. 2B, embodiments use time base 208 of a single cycle as input to a single comparator 209 which provides an output to enable the counter 210. As mentioned above, the propagation delay drift occurs only once so its impact is divided by two (2). Moreover this propagation delay drift has to be compared to much longer pulse duration (32 us in current example). The frequency error induced by propagation delay drift is thus dramatically reduced. Embodiments allow, for example, a 1 ns maximum propagation delay drift over temperature and supply voltage ranges (10 times bigger) which is much easier to reach. The frequency drift is now 1 ns/32 us or 0.003%. The frequency drift induced by such 1 ns propagation delay drift is, for this example, 266 times smaller with the method according to embodiments. Even with a 10 ns maximum propagation delay drift over temperature and supply voltage ranges we would still be well in specs with a 0.03% error. Therefore, in embodiments, comparator propagation delay (and delay drift) can be neglected.

Figure 3A:
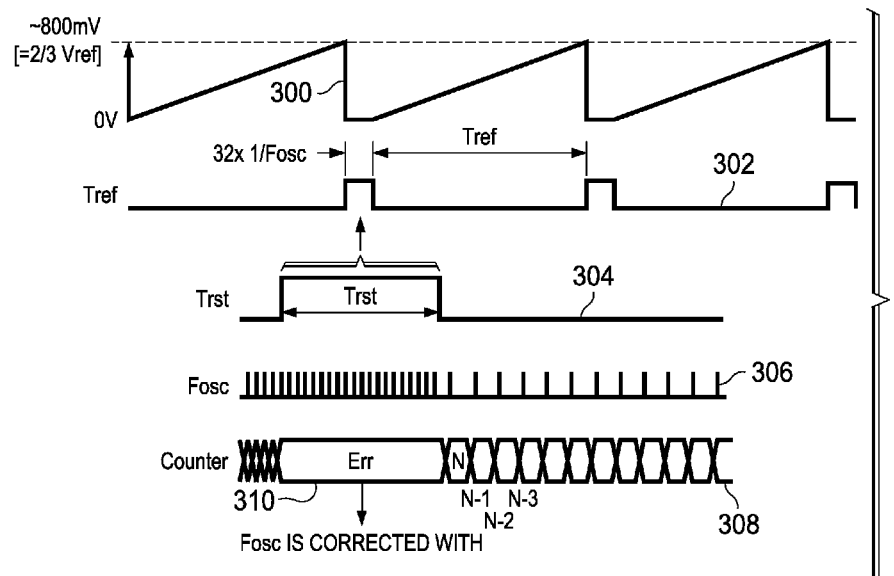
FIG. 3A and FIG. 3B illustrate exemplary operation of embodiments in greater detail.
Figure 3B:
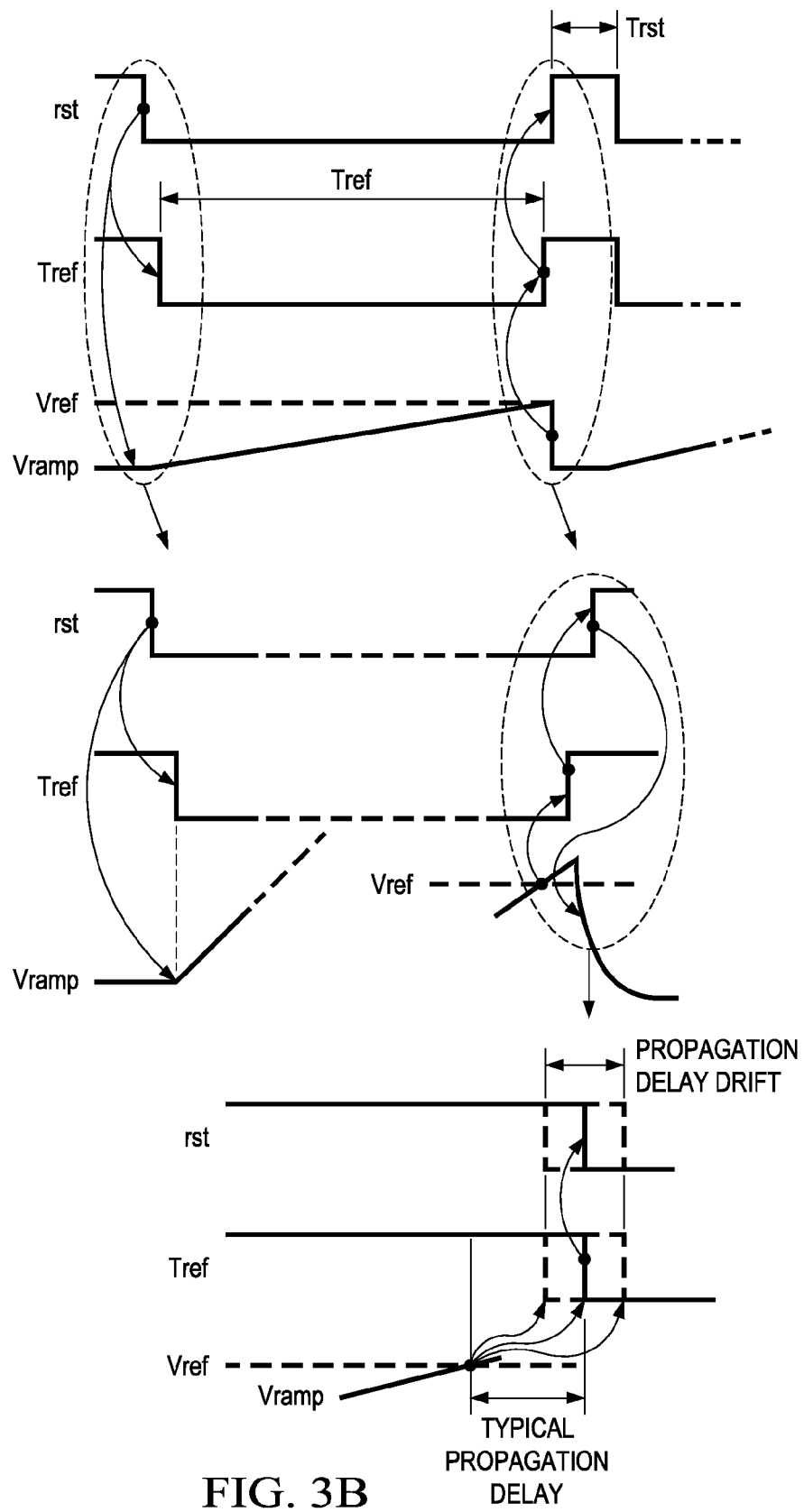

FIG. 3A and FIG. 3B show the function of the circuit shown in FIG. 1 in more detail. According to various embodiments, the digital tuning of the loop gain is performed instead of the RC time base itself. This prevents degrading temperature accuracy through time base trimming. Tuning an RC often involves a matrix of resistors and switches, which may become particularly sensible to leakage at high temperature. According to specific implementations, there may be phase noise on the Tref time base that will be visible in a spectrum analysis.

Shown at 300 is the ramp waveform timebase generated by RC timebase 106 (FIG. 1). As shown at 302, the resulting Tref is a pulse between the ramps of the waveform 300. That is, the rising edge of Tref indicates that current Tref window has elapsed (the end of a ramp) while the falling edge indicates that the next Tref window has started (beginning of a new ramp). The duration of Tref high is used to process the error and to reset both the ramp generator and the HF counter 102. Shown at 304 is Tref high, referred to as Trst. Usually the longest time requirement for Trst is the time needed to reset the ramp generator. As explained earlier, the reset time has to be large enough for ensuring a full reset of the RC time base but should be short enough to prevent a dead time (where nothing occurs) after the full reset of the time base. Preferably, as well, the Trst pulse should be easy to generate. This may be achieved counting a certain number of clock pulses of the High Frequency oscillator 110. As noted above, a good trade-off is counting 32 clock pulses of the HF oscillator as shown at 304 and 306, in the embodiment illustrated. In other embodiments, a different number of clock pulses may be counted.

In the following sections, it is assumed that the digital integrator output code is always positive, ranging from 0 to the max DAC input code (2047 for a 11 bit DAC as shown in FIG. 1) and that the High Frequency oscillator 110 outputs a frequency that ranges linearly from Fmin (code 0) to Fmax (code 2047). Thus, the digital integrator output code is always a positive number; while the error code may be positive or negative (the integrator output code may increase or decrease).

In operation, the counter 102 starts counting HF clock pulses at the opening of the Tref window (falling edge of Tref pulse) and stops counting when Tref windows closes (rising edge of Tref pulse indicating that Tref elapsed). From this point an error signal is generated. The ERR signal is the difference between the count result of the HF counter 102 and the calibration code n0 (ideally this ERR signal is 0). The ERR signal is output to the digital integrator 108 which generates the updated trimming code CODE=CODE$^{-1}$−ERR. Therefore, the new trimming code is the previous period's code value (CODE$^{-1}$) minus the error code. The result is output to the DAC 112 and is used to adjust the Fosc. The new Fosc signal is then provided again to the counter, which starts counting again at the opening of the next Tref window. In the example illustrated, the previous frequency was too high.

In the illustrated embodiment, generating the error code employs a counter that is reset before each calibration window, then counts HF clock pulses during the calibration windows. Once the calibration windows close, the calibration code n0 is subtracted for extracting the error code. Another method for generating the error code is using an up-down counter which is preset with the reference code n0

(rather than reset) before each calibration window. From this point, the up-down counter starts counting down the clock pulses coming from the HF clock at the opening of the calibration window until the calibration windows ends or the output value of the up-down counter reaches zero. Then, if the output value of the up-down counter reaches zero before the end of the calibration window, the up-down counter starts counting up, until the end of the calibration window. With this method, the value present at the output of the up-down counter at the end of the calibration window (counter result) is equal to the error: When the HF frequency is calibrated, the number of HF clock pulses that occurred during the calibration window is equal to n0 and the counter result is zero. If the HF frequency is too low, the number of HF clock pulses that occurred during the calibration window is less than n0 and the counter result reflects the number of missing pulses. This result is considered as a negative number since it occurs during the down counting phase. If the HF frequency is too high, the number of HF clock pulses that occurred during the calibration window exceeds n0 and the counter result reflects the excess of HF pulse count. This result is considered as a positive number since it occurs during the up counting phase. Thus, the up-down counter result at the end of the calibration windows is equal to the absolute value of the error code while the polarity of the error code is given by the up-down bit (up=>positive or down=>negative).

In any case, the error code should be (and remain) zero as soon as the HF oscillator is tuned. However it will sometimes change to +1 or −1 for cancelling a frequency drift related to HF oscillator supply voltage, temperature change or any other drift cause. It is noted that using a 2 complement representation for the error code implies that all the bits toggle from zero to one when the error code changes from zero (0) to minus one (−1). This can be avoided if a signed representation is used for the error code. In that case, only two bits toggle, the LSB (Least Significant Bit) and the sign bit. This minimizes the noise induced by toggling all error bits.

Getting a signed error code may be implemented relatively easily with the up down counter embodiment. Counting down proceeds as described since the value of the up-down bit directly provides error code polarity (up=>positive/down=>negative).

Let now consider the tuning accuracy. As described, earlier the error code is zero when the HF oscillator is tuned and this error may become +1 or −1 due to the frequency drift of the HF oscillator. One (1) error count represents 1/n0 relative error. Therefore the tuning accuracy is 1/n0 (where n0 is the calibration code.). Thus, in order to reach 0.1% accuracy the minimum value for n0 is 1000 (one thousand).

About the digitally controlled HF oscillator side: 1LSB (Least Significant Bit) represents a frequency step of (Fmax−Fmin)/$2^m$ where m is the DAC resolution (number of bit). Let define $f_0$=(Fmax+Fmin)/2 as the median frequency and $\Delta f$=(Fmax−Fmin) as the frequency tuning range. So 1LSB step represents a $\Delta f/(2^m*f_0)$ relative change in the HF frequency. In order to reach 0.1% accuracy the minimum value for m is $\log_2(1000*\Delta f/f_0)$ where $\log_2(x)$ is logarithm in base 2 of x. As an example, m should be greater than 9 if $\Delta f/f_0$=0.5.

As for any closed loop system there are stability criteria. Here, stability of the tuning loop depends on the ratio between 1 error count relative deviation (1/n0) and 1LSB relative deviation ($\Delta f/(2^m*f_0)$) of the HF oscillator frequency. Ideally, 1 error count should represent the same relative deviation than 1LSB: The frequency would thus be tuned after one calibration period. This means that n0 should ideally be equal to $2^m*f_0/\Delta f$. But this is usually not the case, so more than one calibration period may be needed for tuning the frequency. The tuning is unconditionally stable and have no ringing when 1LSB relative deviation of the HF oscillator frequency is smaller than 1 error count relative deviation $\Delta f/(2^m*f_0)$<1/n0. This may be rewritten: The tuning loop is unconditionally stable and has no ringing when $\Delta f/f_0$<$2^m$/n0. It becomes conditionally stable with ringing when 1/n0<$\Delta f/(2^m*f_0)$<2/n0. It is unstable when $\Delta f/f_0$>2*($2^m$/n0).

This can be easily understood via an example: Assume that 1 count is 0.1% and 1LSB relative deviation of the HF oscillator frequency is equal to 0.5 count (0.05%). We have thus $\Delta f/(2^m*f_0)$=0.5/n0 which is less than 1/n0. This corresponds to the first case where the tuning loop is unconditionally stable. Consider now that the error count is +8 meaning that the HF frequency is 0.8% (8*0.1) above the desired value. This induces a correction of −8LSB in the DAC code. The resulting frequency change is (−8*0.05%) thus −0.4% and the frequency error after the first calibration window is 0.4% (0.8%−0.4%) The error measured during the next calibration window will thus be +4 counts, then +2 counts then 1 count and finally zero count indicating a tuned oscillator. Here the frequency tends to its tuned value without ringing around the final value.

Assume now that 1 count is still 0.1% but 1LSB relative deviation of the HF oscillator frequency is equal to 1.5 counts (0.15%). We have now $\Delta f/(2^m*f_0)$=1.5/n0. This corresponds to the second case where the tuning loop is conditionally stable. Consider again that the error count is +8 meaning that the HF frequency is 0.8% (8*0.1) above the desired value. This induces a correction of −8LSB in the DAC code. The resulting frequency change is now −1.2% (−8*0.15%). This means that the DAC correction exceeds the error and after the first calibration period the HF frequency is lower than the desired value by −0.4% (0.8%−1.2%) The error measured during the next calibration window will then be −4 counts, then +2 counts then −1 count and finally zero count. So here the frequency still tends to its tune value while ringing around the final value.

Finally, assume that 1 count is still 0.1% but 1LSB relative deviation of the HF oscillator frequency is equal to 2 counts (0.2%). We have now $\Delta f/(2^m*f_0)$=2/n0. This corresponds to the second case where the tuning loop is unstable. Let consider again that the error count is +8 meaning that the HF frequency is 0.8% (8*0.1) above the desired value. This induces a correction of −8LSB in the DAC code. The resulting frequency change is now −1.6% (−8*0.2%). This means that now the DAC correction is twice the error. Thus after the first calibration period the HF frequency is lower to the desired value by −0.8% (0.8%−1.6%) The error measured during the next calibration window will then be −8 counts, then +8 counts then −8 counts and the HF oscillator rings by 0.8% around the desired value. The system became unstable. The ringing amplitude would increase with an LSB value greater than 2 counts ($\Delta f/(2^m*f_0)$>2/n0).

The system according to embodiments is unconditionally stable when 1 LSB relative frequency deviation of the HF tuning DAC is equal or smaller than 1/n0 (1 count relative error in the frequency measurement). This may be expressed either as $\Delta f/(2^m*f_0)$<1/n0 or n0<$2^m$ $f_0/\Delta f$. It becomes conditionally stable when 1 LSB relative frequency deviation of the HF tuning DAC is larger than 1/n0, but remains reasonably stable as long as 1 LSB relative frequency deviation of the HF tuning DAC remains lower than 1.5/n0

(may be expressed as $\Delta f/(2^m*f_0)<1.5/n0$). This last condition is achieved when $n0<1.5*2^m\ f_0/\Delta f$.

A small LSB value for the HF oscillator DAC allows a fine tuning of the HF frequency. However it increases the settling time to reach the tuned frequency. Under certain conditions, this settling time may be reduced through amplifying the error code. The error code can be easily multiplied by a power of 2 through a bit shift. But amplifying the error code implies virtually amplifying as well the count number n0 and thus modifies the stability condition. If G is the gain applied to the error code, the new stability condition becomes $G*n0<1.5*2^m\ f_0/\Delta f$. This may be re-written as $G<1.5*(2^m\ f_0/\Delta f)/n0$.

Amplifying the error code reduces the settling time but reduces as well the accuracy of the frequency tuning. This drawback (reducing the accuracy of the frequency tuning) may be avoided if LSBs of the error code are kept as they are and the gain G is applied to MSBs (Most Significant Bits) only. From this point we will use the term gain boosting instead of amplifying. We assume as well that we used a signed code (not a 2 complement code).

In order to apply simple gain boosting to the MSBs we consider from now that the gain G is equal to $2^m$ where $m=1, 2, 3 \ldots$ (G=2, 4, 8 \ldots). Therefore applying gain G to MSBs can easily be achieved through a bit shift. 1 bit will be shifted for a gain of 2, 2 bits will be shifted for a gain of 4 and so on (FIGS. 4B and 4C).

Figure 4A:
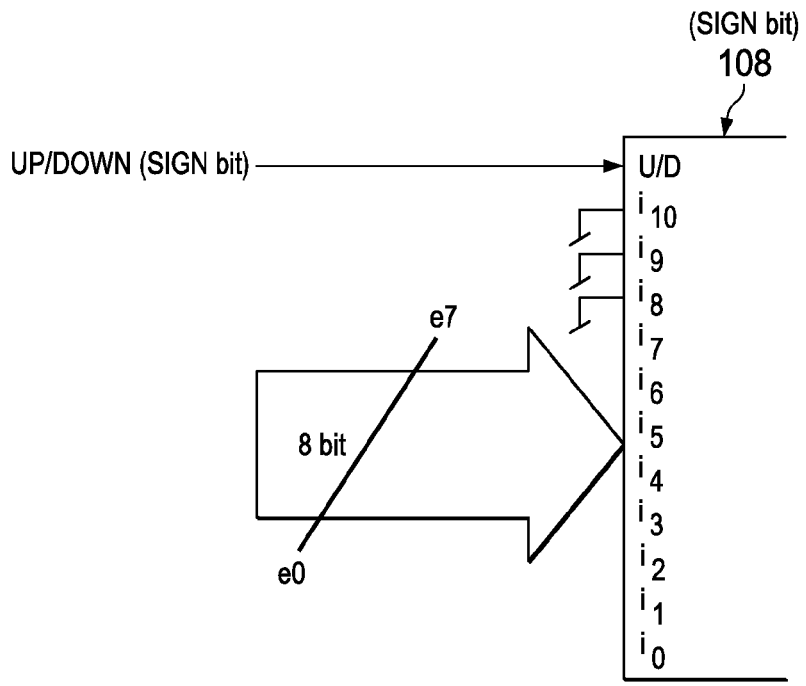
FIG. 4A-FIG. 4C illustrate bit shifting in accordance with embodiments.
Figure 4B:
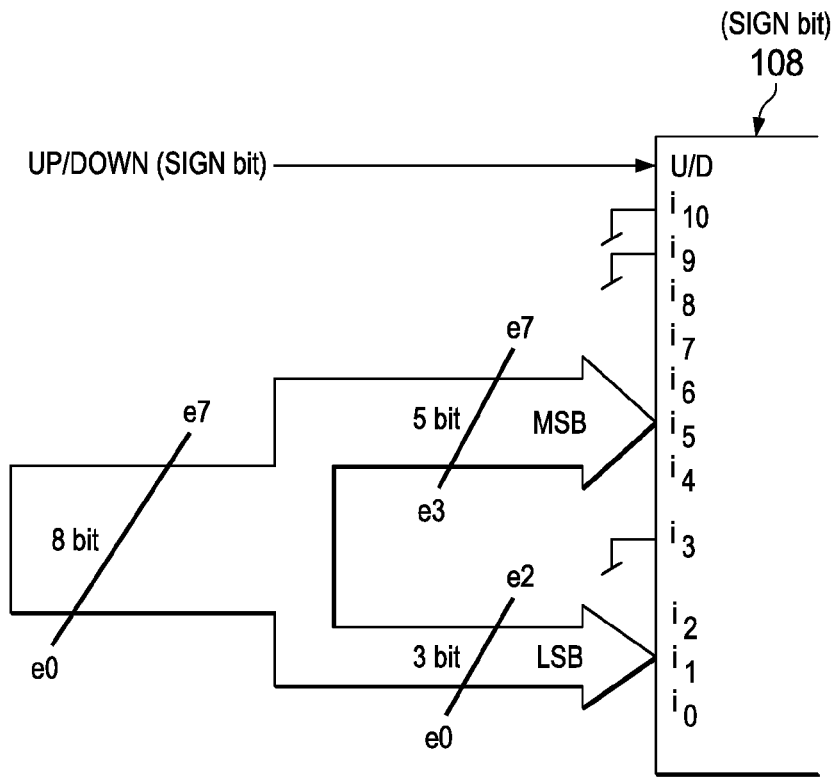
Figure 4C:
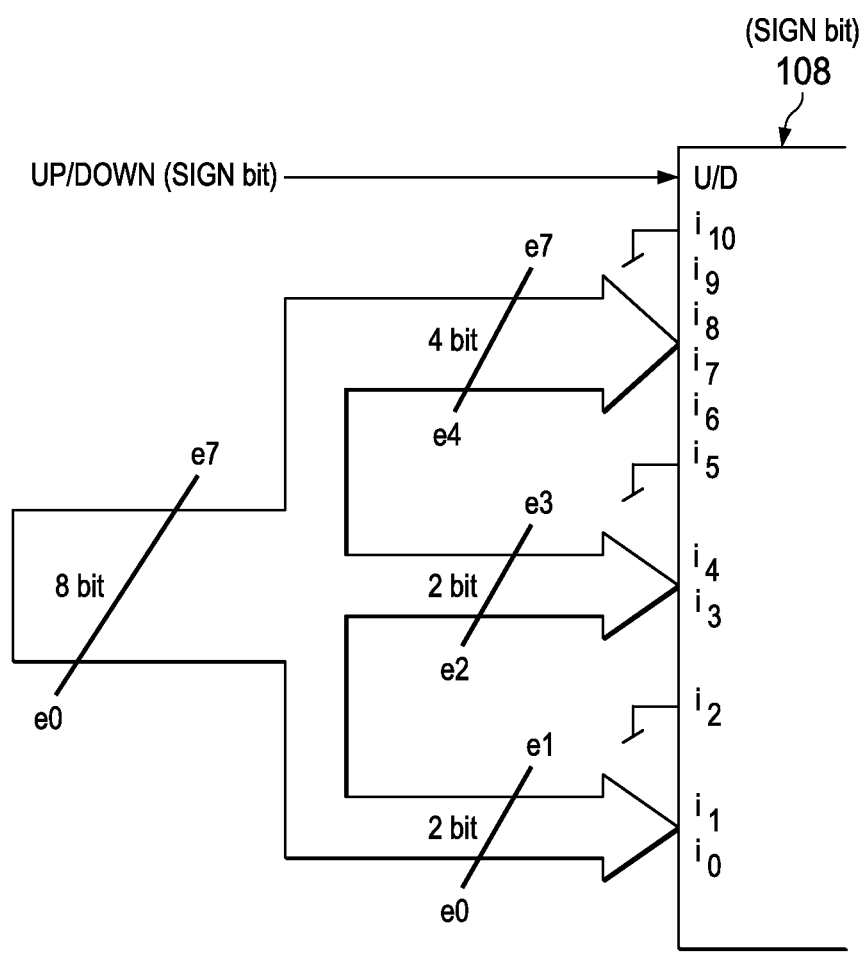

FIG. 4A shows an example application when a 8 bit (reduced) error code is applied to an 11 bit integrator. In the example illustrated, the highest bit weight inputs i8 to HO are not used and thus set to 0 (zero), that is, usually ground voltage. FIGS. 4B and 4C illustrate gain boosting through bit shifting.

To clarify what bit shift means, assume an 8 bit error word for which the 3 LSBs (e0 to e2) are unchanged and the 5MSBs (e3 to e7) are gain boosted. So bits e0 to e2 will be applied to inputs i0 to i2 of the digital integrator 108 while, for a gain of 2, bits e3 to e7 will be applied to inputs i4 to i8 of integrator 108 (rather than to inputs 12 to i7) and input i3 will be set to 0. So bits e3 to e7 are shifted by 1 bit at the input of integrator 108 in order to achieve the gain of 2 (FIG. 4B). For achieving a gain of 4, bits e3 to e7 should be shifted by 2 bits which means that they are connected to the inputs i5 to i9 of the integrator 108 while inputs i3 and i4 are set to 0. In most cases, the gain G will be limited to 2 or 4. For a gain of 2, applying gain G from the fourth bit is a good trade off (although it can be applied from other bits). This means that the three Least Significant Bits (bit 0 to bit 2) are not gain boosted as described above (FIG. 4B). When gain G is equal to 4, different gain boosting may be applied according to bit weight: Here a good trade-off is keeping the two LSB (bit e0 and e1) unchanged, gain boost two (2) the two next bits (bits e2 and e3) and gain boost four (4) the upper bits (FIG. 4C).

As mentioned earlier, the error code will be a very small number (positive or negative) as soon as the HF oscillator is tuned to the correct frequency Therefore the error code requires only a few bits to maintain the HF oscillator tuning. This induces another advantage using an up down counter with signed output: Both the up-down counter and the error code may have fewer bits than the integrator result word. Using the 2 complement representation for the error code requires the same number of bits for the integrator output word and both the up-down counter and error word. If a reduced error code is used, all unused inputs of the integrator must be set equal to the MSB (Most Significant Bit) of the error word that is the sign bit.

Having only few bits for the error code thus helps saving layout area. Cost for that is that a longer time (higher number of calibration periods) may be needed at start-up for the HF oscillator to be tuned. A longer start-up time may occur when the HF oscillator initial frequency at start-up is far away from its tuned value. In this case, the error count result is large and its magnitude may exceed the magnitude allowed by the reduced number of bits of the error code. This induces a clamping (or a saturation) of the error code provided to the integrator. The error correction applied to the integrator is thus less than it should be and several successive calibration periods may be needed until the error word gets out of saturation. But as soon as the error code gets out of saturation there is no longer any difference between the reduced and a full size error code. In most of the applications this increased tuning time at start-up isn't an issue, thus a reduced size (number of bit) error code may be used.

As long as it meets stability requirement the gain boosting technique described above should be applied to the reduced size error code in order to minimize the tuning time.

Another way to gain-boost the error code is counting during 2 successive counting windows. This means that the up-down counter is reset at the beginning of a double windows period (beginning of the first ramp). Then it is stopped (blanked) during the ramp generator resetting and turn-on again at the beginning of the second ramp. The error count that occurs at the end of the second ramp is then processed normally. This technique doubles the magnitude of the error code. It need of course presetting the up-down counter with a value equal to 2*n0.

Counting during 2 successive counting windows doesn't help reducing the tuning time. In most of the cases it will increase it. However this technique provides two significant improvements: It the doubles the accuracy of the tuning (since it doubles the count number) and it allows chopping the time-base reference. Chopping critical elements (such as the ramp generator or the comparator) in the time base reference allows cancelling $1/f$ noise and mismatch effects in these blocs. This dramatically increases the accuracy of the reference time-base and thus the overall accuracy of High Frequency clock (40 MHZ).

Chopping the reference time-base during the ramp generator reset prevents inducing undesired errors due to the chopping process.

Counting during 2 successive counting windows allows applying standard (first order) chopping sequence. Further accuracy improvement for the reference time-base may be achieved when a second, or higher, order chopping sequence is applied. Such a sequence is described in U.S. Pat. No. 6,909,388 B1 "Fractal sequencing schemes for sampled data acquisition systems" by Vincent Quiquempoix and Philippe Deval, which is hereby incorporated by reference in its entirety as if fully set forth herein. Note that standard (first order) chopping sequence requires 2 successive counting windows while second order sequence requires 4 successive counting windows. Third order sequence would require 8 successive counting windows and so on. This means that both the duration of the counting period and the number of counts (thus error count gain) are multiplied by 2 for a standard chopping sequence, multiplied by 4 for a second order chopping sequence, 8 for a third order chopping sequence and so on. Consequently applying high order fractal sequence may increase too much the error code gain and push the system out of the stability condition. Therefore the user will usually limit chopping sequence to first or second order Referring to U.S. Pat. No. 6,909,388 B1, a standard (first order) chopping sequence means that the chopping sequence is +,−,+,−,+,− . . . . So the basic first order chopping sequence is +,− (or −,+). The basic second order chopping sequence is +,−,−,+ while the basic third order chopping sequence is +,−,−,+,−,+,+,− and so on.

Note that it is possible to emulate a second order sequence by averaging the error code of two (2) successive error first order chopping sequences that have opposite sequence: Let have the first chopping sequence to be +,− while the second chopping sequence is −,+(thus opposite sequence). Doing that, the averaged error value after the 2 successive first order sequences is the same than the one after a second order sequence. However the gain on the error code is 2 instead 4. This helps for maintaining the stability of the system.

The averaging technique of opposite chopping sequence may be applied to higher order chopping sequences.

The bit shift technique and chopping technique may be combined together.

A third way for gain boosting the error code, and improving the tuning resolution and accuracy may be operating the HF oscillator at m times the desired final clock frequency and provides HFosc/m as final HF clock. Gain m should be an integer number. This implies that the number of count during the Tref period is multiplied by m.

Operating the HF oscillator at m times the required final HF clock provides the same tuning resolution and accuracy than multiplying Tref window duration by m, or cumulating counts of m successive Tref periods having original duration, thus reduces globally the tuning time. However multiplying the HF oscillator frequency renders its design critical.

However operating the HF oscillator at twice (2 times) the required final HF clock may be an interesting solution for applications where 50% duty-cycle of the HF clock is required.

The described technique is based on a very low drift time reference base Tref to be used for tuning an HF clock. The Clock frequency is tuned in such a way that the duration of n0 periods of the HF clock oscillator is equal to the duration of the very low drift time reference. Therefore, n0=HFclk/Tref where HFclk is the desired HF frequency. In the above description the Tref time base is based on a very low drift RC time base. However any low drift time base, such as crystal or coaxial resonator, may be used. The advantage of the RC time base is saving cost for the resonator and 2 pins for connecting it. Cost saving for a 40 MHz crystal may be significant since a 40 MHz crystal isn't very common. However a 32.768 KHz crystal (Watch crystal) is relatively inexpensive. It provides a Tref duration of about 30.5 us that is close to the typical 32 us used in above description.

The 32.768 KHz clock provided from the crystal watch oscillator will usually be a rectangular waveform with a typical duty cycle of in the range of 30 to 70% that significantly differs from the waveform shape of the Tref signal provided by the described very low drift RC oscillator. This clock signal as is isn't compatible with the system described above. Therefore it cannot be applied as is as the Tref signal but must be shaped.

Figure 5:
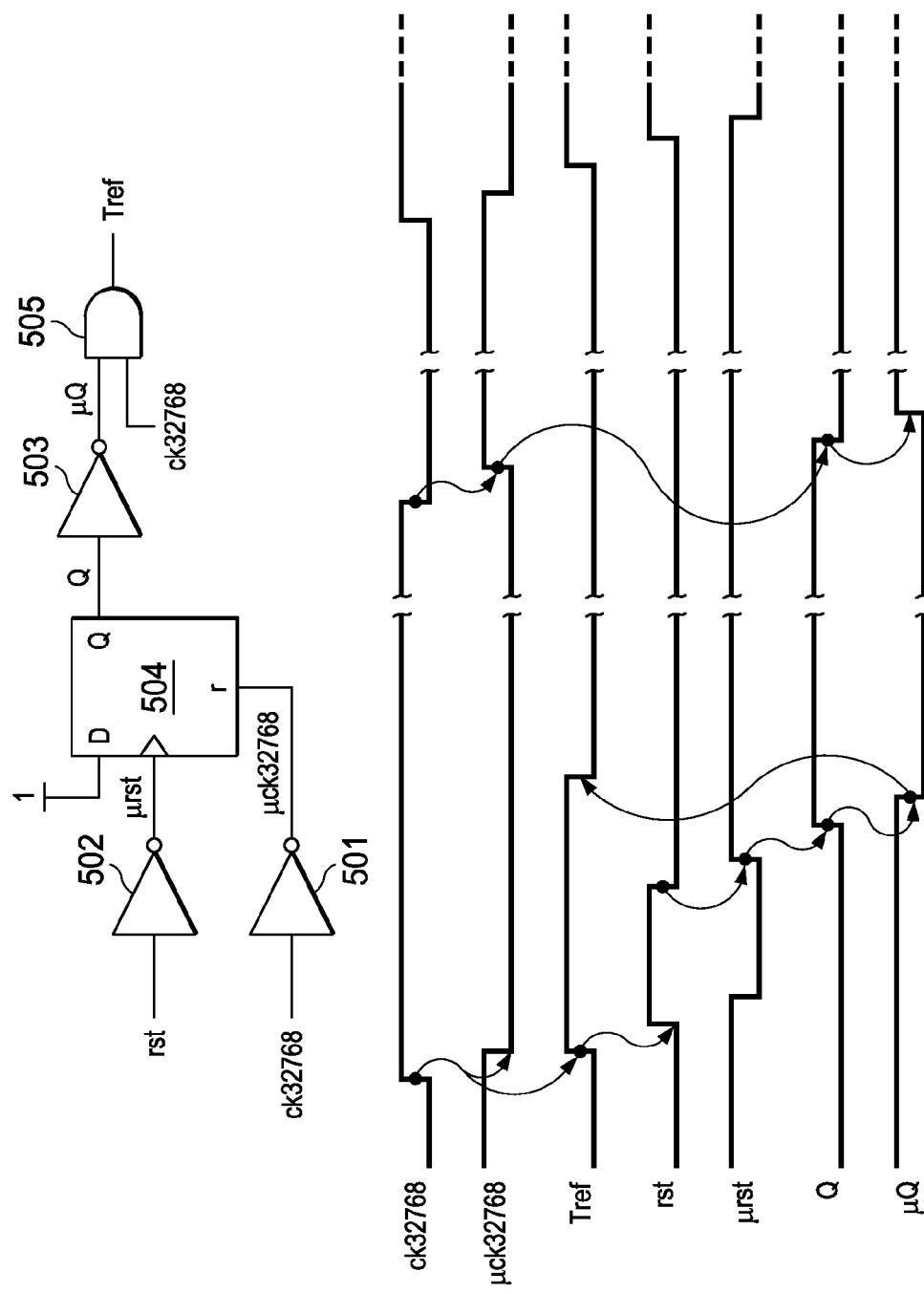
FIG. 5 illustrates use of a crystal watch clock in accordance with embodiments.

FIG. 5 illustrates a possible circuitry for shaping the 32.768 KHz from the crystal watch oscillator. In order to provide easy understanding of the proposed shaping circuit, positive logic only is used. The watch oscillator clock is applied to the reset input of a D flip-flop 504 through a 1$^{st}$ inverter 501 in order ensuring D flip-flop 504 to be reset during the low state of the crystal watch clock ck32768. D flip-flop 504 has its D input set to digital 1 (high) level and its clock input driven through a 2$^{nd}$ inverter 502 by the rst signal coming from synchro circuitry 104. Thus the Q output of D flip-flop 504 toggles to 1 (high) at the falling edge of the rst signal coming from synchro circuitry 104. The watch oscillator clock is also applied to a 2 inputs AND gate 505 that has its 2$^{nd}$ input driven by the inverted Q output of D flip-flop 504. Inverted Q output of D flip-flop 504 is provided via third inverter 503.

During the low state (0) of the crystal watch clock ck32768 the D flip-flop 504 is reset as explained above: therefore its Q output is low (0) and inverted Q output signal after inverter 503 is high (1). The Tref signal at the output of AND gate 505 is low (0) since ck32768 signal is low. Then at the rising edge of ck32768 signal, the Tref signal at the output of AND gates 505 toggles to 1 (high). This transition enables the rst signal. According to previous embodiment the rst signal stays at 1 (high) during 32 clock periods of the HF clock then returns to 0 (low). This falling edge on rst signal induces the Q output of D flip-flop 504 toggling to 1 (high) as explained in the previous section and the output of inverter 503 toggling to 0 (low). This induces the Tref signal at the output of AND gate 505 toggling to 0 as well. The Tref signal provided by the proposed shaping circuit is therefore similar to the one achieved with the low drift RC time base.

The proposed shaping circuit doesn't provide a glitch at the falling edge of the ck32768 clock signal since second input of AND gate 405 returns to 1 (high) 3 gates delays after the falling edge of ck32768 clock signal.

It is noted that the duration of the Tref signal achieved with the proposed shaping circuit of FIG. 5 is slightly smaller than the ck32768 clock signal period. It is equal to the ck32768 clock signal period minus the duration of the reset period (32*Thf according to some embodiments). Therefore n0 would be equal to 1189 (40 MHz/32.768 KHz−32) according to some embodiments.

A watch crystal oscillator requires several milliseconds, or several tens of milliseconds to start oscillations, however it requires an operating current in the range of the uA (micro-ampere) for maintaining oscillations. Therefore it may remain always powered without impacting significantly sleep-mode consumption. Maintaining the watch crystal oscillator always powered implies that its starting time will only occur at power-up.

Another way to provide an accurate external time base is using a 4 MHz crystal. 4 MHz crystals are common and thus relatively inexpensive. The 4 MHz clock is divided by 128 in order providing a 32 us time base. Starting time of a 4 MHZ crystal oscillator is quite fast, thus the 4 MHZ crystal oscillator may be turned off during sleep mode.

Generally any accurate time base may be used as the reference time base. A shaping circuit may be needed in order providing adequate Tref waveform. The depicted shaping circuit of FIG. 5 may be used.

Although the invention has been described with respect to specific embodiments thereof, these embodiments are merely illustrative, and not restrictive of the invention. The description herein of illustrated embodiments of the invention, including the description in the Abstract and Summary, is not intended to be exhaustive or to limit the invention to the precise forms disclosed herein (and in particular, the inclusion of any particular embodiment, feature or function within the Abstract or Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Abstract or Summary. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, process, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, including the claims that follow, a term preceded by "a" or "an" (and "the" when antecedent basis is "a" or "an") includes both singular and plural of such term, unless clearly indicated within the claim otherwise (i.e., that the reference "a" or "an" clearly indicates only the singular or only the plural). Also, as used in the description herein and throughout the claims that follow, the meaning of "in" includes "in" and "on" unless the context clearly dictates otherwise.

It will be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/Figures should be considered only as exemplary, and not limiting, unless otherwise specifically noted.

What is claimed is:

1. A clock oscillator comprising:
   a high speed oscillator generating a high speed clock signal and comprising a digital to analog converter providing a trimming function;
   a counter receiving said high speed clock signal at a clock input;
   a time base having a very low drift and controlling said counter, wherein the counter generates a difference value between a reference value and a counter value; and
   a digital integrator having an m-bit input and receiving said difference value being an integer and comprising n-bits, wherein n<m, n and m being greater than zero, and providing trimming data for said high speed oscillator, wherein only Most Significant Bits (MSB) of the n-bit integer difference value are shifted at the m-bit input of the digital integrator in order to reduce a tuning time while remaining bits of the n-bit integer difference value remain un-shifted.

2. The clock oscillator according to claim 1, wherein the reference value is permanently stored in a one-time programmable memory.

3. The clock oscillator according to claim 1, wherein the time base is an RC time base.

4. The clock oscillator according to claim 1, wherein the time base is reset by said counter.

5. The clock oscillator according to claim 1, wherein the counter is configured to receive a time base output at an enable input.

6. The clock oscillator according to claim 1, wherein the reference value is an estimate of the duration of the time base.

7. The clock oscillator according to claim 1, wherein the trimming data is indicative of the difference value and a previous period trimming data.

8. A clock oscillator in accordance with claim 1, wherein the counter comprises an up down counter.

9. An integrated circuit, comprising:
   a time base circuit generating a time reference;
   a counter receiving the time reference and configured to generate an error signal based on the difference between a count number of HF clock pulses occurring along the time reference duration and a calibration number;
   a digital integrator comprising an k-bit input and being configured to generate a trimming function based on the error signal, wherein the error signal comprises n-bits which are fed to the k-bit input of the digital integrator, wherein n<k, n and k being greater than zero, and wherein the Most Significant Bits (MSB) of the error signal are fed to the digital integrator such that they are shifted at the k-bit input of the digital integrator in order to reduce a tuning time whereas remaining bits of the n-bits of the error signal are fed un-shifted to the digital integrator; and a high speed oscillator controllable using the trimming function and configured to provide the HF clock pulses to the counter.

10. An integrated circuit in accordance with claim 9, wherein the error signal is based on the difference between the count number of HF clock pulses occurring along the time reference duration and a programmable calibration code.

11. An integrated circuit in accordance with claim 10, wherein the programmable calibration code is stored into a one time programmable memory.

12. An integrated circuit in accordance with claim 10, wherein the programmable calibration code is stored into a non volatile rewritable memory.

13. An integrated circuit in accordance with claim 9, wherein the time base circuit comprises a very low drift RC circuit.

14. An integrated circuit in accordance with claim 9, wherein the time base circuit is provided through a watch crystal.

15. An integrated circuit in accordance with claim 13, wherein a programmable calibration code is representative of a duration of the time reference provided by the very low drift RC circuit.

16. An integrated circuit in accordance with claim 14, wherein the programmable calibration code is representative of the duration of one period of a 32.768 KHz watch crystal.

17. An integrated circuit in accordance with claim 9, wherein a programmable calibration code is representative of the duration of m periods of a crystal.

18. An integrated circuit in accordance with claim 9, wherein the time base circuit is derived from any accurate time base.

19. An integrated circuit in accordance with claim 9, wherein the time reference is based on a single cycle of an output of a very low drift RC circuit.

20. An integrated circuit in accordance with claim 9, wherein the time reference is based on multiple cycles of an output of a very low drift RC circuit.

21. An integrated circuit in accordance with claim 9, wherein the time reference is based on a single period of a 32.768 KHz watch crystal.

22. An integrated circuit in accordance with claim 9, wherein the time reference is based on multiple periods of a 32.768 KHz watch crystal.

23. An integrated circuit in accordance with claim 9, wherein the time reference is based on a single period of any accurate time base.

24. An integrated circuit in accordance with claim 9, wherein the time reference is based on multiple periods of any accurate time base.

25. An integrated circuit in accordance with claim 9, wherein the time reference is configured to enable the counter.

26. An integrated circuit in accordance with claim 9, wherein an error code size is limited.

27. An integrated circuit in accordance with claim 9, wherein n=8 and k=11.

28. An integrated circuit in accordance with claim 24, wherein a different shift is applied according to a bit weight.

29. An integrated circuit in accordance with claim 9, wherein the high speed oscillator is operated at a multiple of a final HF output frequency.

30. A method, comprising:

generating a time reference based on a time base;

providing HF clock pulses with a HF oscillator;

counting the HF clock pulses during a duration of the time reference;

generating an n-bit error signal based on the HF clock pulses count of the duration of the time reference and a calibration signal;

generating a trimming signal based on the n-bit error signal, wherein only a predefined number of Most Significant Bits (MSB) of the n-bit error signal are shifted at an m-bit integrator input, wherein n<m, n and m being greater than zero, for generating the trimming signal in order to reduce a tuning time while remaining bits of the n-bit error signal are fed un-shifted to the m-bit integrator input; and controlling a high speed oscillator using the trimming signal.

31. A method in accordance with claim 30, wherein the calibration signal is a one time programmable signal representative of an estimated error in the time reference.

32. A method in accordance with claim 31, wherein the time reference is generated using a very low drift RC circuit.

33. A method in accordance with claim 32, wherein the time reference is generated using a single comparator receiving as input a single cycle of the very low drift RC circuit output.

34. A method in accordance with claim 33, wherein the time reference is input to an enable input of a counter for counting the duration of the time reference.

* * * * *